United States Patent
Lu et al.

(10) Patent No.: US 11,903,182 B2
(45) Date of Patent: Feb. 13, 2024

(54) CAPACITOR AND MANUFACTURING METHOD THEREFOR

(71) Applicant: SHENZHEN GOODIX TECHNOLOGY CO., LTD., Shenzhen (CN)

(72) Inventors: Bin Lu, Shenzhen (CN); Jian Shen, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 760 days.

(21) Appl. No.: 17/022,439

(22) Filed: Sep. 16, 2020

(65) Prior Publication Data
US 2021/0005610 A1 Jan. 7, 2021

Related U.S. Application Data

(63) Continuation of application No. PCT/CN2018/124945, filed on Dec. 28, 2018.

(51) Int. Cl.
*H01L 29/00* (2006.01)
*H01G 13/00* (2013.01)
(Continued)

(52) U.S. Cl.
CPC .............. *H10B 12/30* (2023.02); *H01G 4/228* (2013.01); *H01G 4/30* (2013.01); *H01G 13/00* (2013.01); *H01L 28/60* (2013.01)

(58) Field of Classification Search
CPC .... H10B 12/30; H10B 12/37; H10B 12/0385; H10B 12/09; H10B 12/038; H10B 12/00;
(Continued)

(56) References Cited

U.S. PATENT DOCUMENTS 5,354,701 A  10/1994 Chao
5,874,757 A  2/1999 Chao
(Continued)

FOREIGN PATENT DOCUMENTS

CN  101682252 A  3/2010
CN  101341576 B  5/2012
(Continued)

*Primary Examiner* — Nikolay K Yushin

(57) ABSTRACT

A capacitor includes: a semiconductor substrate; at least one trench provided in the semiconductor substrate and formed downward from an upper surface of the semiconductor substrate; a first conductive layer provided above the semiconductor substrate and in the trench; a first insulating layer provided between the substrate and the first conductive layer to isolate the first conductive layer from the substrate; a second conductive layer provided above the r substrate and in the trench, the second conductive layer including a first and a second conductive region that are independent from each other, the first conductive region being electrically connected to the substrate, and the second conductive region being electrically connected to the first conductive layer; and a second insulating layer provided between the first and the second conductive layer to isolate the first conductive region from the first conductive layer and isolate the second conductive region from the substrate.

19 Claims, 12 Drawing Sheets

(51) Int. Cl.
*H10B 12/00* (2023.01)
*H01G 4/228* (2006.01)
*H01G 4/30* (2006.01)
*H01L 49/02* (2006.01)

(58) Field of Classification Search
CPC ............ H01G 4/228; H01G 4/30; H01G 4/33; H01G 13/00; H01L 28/60; H01L 28/40; H01L 28/90; H01L 28/91; H01L 29/945; H01L 29/94; H01L 29/7803; H01L 29/0634; H01L 29/4236
See application file for complete search history.

(56) References Cited

U.S. PATENT DOCUMENTS

| | | | |
|---|---|---|---|
| 8,085,524 B2 | 12/2011 | Roozeboom et al. | |
| 8,395,914 B2 | 3/2013 | Klootwijk et al. | |
| 9,105,759 B2 | 8/2015 | Chou et al. | |
| 9,159,723 B2 | 10/2015 | Chou et al. | |
| 9,178,080 B2 | 11/2015 | Kalnitsky et al. | |
| 9,397,152 B2 | 7/2016 | Cheng et al. | |
| 9,793,340 B2* | 10/2017 | Voiron | H01L 28/91 |
| 2008/0291601 A1 | 11/2008 | Roozeboom et al. | |
| 2010/0117612 A1 | 5/2010 | Klootwijk et al. | |
| 2012/0061798 A1 | 3/2012 | Wong et al. | |
| 2013/0183805 A1 | 7/2013 | Wong et al. | |
| 2014/0145299 A1 | 5/2014 | Kalnitsky et al. | |
| 2015/0076657 A1 | 3/2015 | Chou et al. | |
| 2017/0053979 A1* | 2/2017 | Voiron | H01L 28/65 |

FOREIGN PATENT DOCUMENTS

| | | |
|---|---|---|
| CN | 103208415 A | 7/2013 |
| CN | 104465521 A | 3/2015 |
| JP | H01220856 A | 9/1989 |
| WO | WO2007054858 A2 | 5/2007 |

* cited by examiner

CAPACITOR AND MANUFACTURING METHOD THEREFOR

CROSS REFERENCE TO RELATED APPLICATIONS

The present disclosure is a continuation of international application No. PCT/CN2018/124945, filed on Dec. 28, 2018, which is hereby incorporated by reference in its entirety.

TECHNICAL FIELD

The present disclosure relates to the field of capacitors, and more particularly, to a capacitor and a manufacturing method for the same.

BACKGROUND

A capacitor can play a role of bypassing, filtering, decoupling, or the like in a circuit, which is an indispensable part for ensuring a normal operation of the circuit. A silicon capacitor is a capacitor manufactured on a silicon wafer using semiconductor processing techniques. Compared with a traditional planar silicon capacitor, a three-dimensional (3 Dimensions, 3D) silicon capacitor increases a surface area by processing a 3D structure such as a deep hole and a trench on a substrate, and a capacitance density thereof can reach more than 20 times that of a plate silicon capacitor. At the present stage, based on some concepts of multi-layer nesting in the manufacture of a dynamic random access memory (DRAM), a 3D silicon capacitor is manufactured by alternately depositing a conductor and an insulator material on a surface of a 3D structure to form a structure where a plurality of capacitors are vertically stacked, and then connecting all the capacitors in parallel by different connection manners on a front side of a silicon substrate to finally form a capacitor with a large capacitance value. However, the 3D silicon capacitor manufactured by the above manners requires that a photolithography step (including exposure, development, and etching) is performed many times on a front side of a wafer. For example, to manufacture a silicon capacitor with two insulating dielectric layers, the photolithography step is required to be performed at least five times, which requires not only higher pattern alignment accuracy, but also higher cost.

SUMMARY

The present disclosure provides a capacitor and a manufacturing method therefor, which reduces photolithography steps in a process of capacitor processing and reduces alignment difficulty of multiple photolithography.

In a first aspect, a capacitor is provided, the capacitor including:
 a semiconductor substrate;
 at least one trench provided in the semiconductor substrate and formed downward from an upper surface of the semiconductor substrate;
 a first conductive layer provided above the semiconductor substrate and in the trench;
 a first insulating layer provided between the semiconductor substrate and the first conductive layer to isolate the first conductive layer from the semiconductor substrate;
 a second conductive layer provided above the semiconductor substrate and in the trench, the second conductive layer including a first conductive region and a second conductive region that are independent from each other, the first conductive region being electrically connected to the semiconductor substrate, and the second conductive region being electrically connected to the first conductive layer; and
 a second insulating layer provided between the first conductive layer and the second conductive layer to isolate the first conductive region from the first conductive layer and isolate the second conductive region from the semiconductor substrate.

In some possible implementation manners, the first conductive region is configured as a first electrode of the capacitor, and the second conductive region is configured as a second electrode of the capacitor.

It should be noted that the first conductive region and the second conductive region included in the second conductive layer serve as the first electrode and the second electrode of the capacitor, respectively, that is, in the manufacturing process of the capacitor, two electrodes of the capacitor may be manufactured by performing a photolithography step only once.

Therefore, in a capacitor provided in an embodiment of the present disclosure, a second conductive layer includes a first conductive region and a second conductive region that are independent from each other, the first conductive region is configured as a first electrode of the capacitor, and the second conductive region is configured as a second electrode of the capacitor, which reduces a photolithography step in a process of capacitor processing and reduces alignment difficulty of multiple photolithography.

Optionally, the capacitor provided in the embodiment of the present disclosure is a wafer-level 3D silicon capacitor, which has the characteristics of small size and high capacity, and has excellent performance and stability and a high capacitance density. At the same time, the capacitor described in the embodiment of the present disclosure can play a role of bypassing, filtering, decoupling, or the like in a circuit.

Optionally, the semiconductor substrate is preferably an n-type or p-type heavily doped low-resistivity silicon wafer. A high-resistivity wafer may also be adopted, but after the trench is produced, the upper surface (front side) of the semiconductor substrate and a surface of the trench are required to be doped to form a heavily doped low-resistivity conductive layer.

In some possible implementation manners, the first conductive region and the second conductive region are isolated by air.

In some possible implementation manners, the second insulting layer is provided with at least one window, and the second conductive layer is provided in the at least one window so that the second conductive region is electrically connected to the first conductive layer.

In some possible implementation manners, projected areas of the first insulating layer and the first conductive layer on the semiconductor substrate are the same, and a projected area of the second insulating layer on the semiconductor substrate is larger than the projected area of the first conductive layer on the semiconductor substrate.

In some possible implementation manners, a projected area of the first insulating layer on the semiconductor substrate is larger than a projected area of the first conductive layer on the semiconductor substrate, and a projected area of the second insulating layer on the semiconductor substrate is larger than the projected area of the first conductive layer on the semiconductor substrate.

In some possible implementation manners, the first insulating layer and/or the second insulating layer includes at least one of:

a silicon oxide layer, a silicon nitride layer, a metal oxide layer, and a metal nitride layer.

Optionally, the first insulating layer and/or the second insulating layer includes at least one of: a silicon dioxide layer, a silicon nitride layer, an aluminum oxide layer, a zirconium oxide layer, a hafnium oxide layer, a lead zirconate titanate ($PbZr_xTi_{1-x}O_3$, PZT) layer, and a calcium copper titanate ($CaCu_3Ti_4O_{12}$, CCTO) layer.

For example, the first insulating layer and/or the second insulating layer may be a laminated layer of a material having a high dielectric constant, such as silicon dioxide/aluminum oxide/silicon dioxide ($SiO_2/Al_2O_3/SiO_2$).

Therefore, the first insulating layer and the second insulating layer described in the embodiment of the present disclosure may be laminated layers of a material having a high dielectric constant, so that the capacitor described in the embodiment of the present disclosure has a greater capacitance density.

In some possible implementation manners, the first conductive layer and/or the second conductive layer includes at least one of: a heavily doped polysilicon layer, a carbon-based material layer, a metal layer, and a titanium nitride layer.

Optionally, the above metal layer may be at least one of an aluminum layer, a tungsten layer, and a copper layer.

In some possible implementation manners, the capacitor further includes:

at least one conductive layer provided above the semiconductor substrate and in the trench, and located between the first conductive layer and the second conductive layer; and at least one insulating layer provided between different conductive layers of the at least one conductive layer to isolate the at least one conductive layer respectively, and provided between the second conductive layer and the at least one conductive layer to isolate the second conductive region from the at least one conductive layer and isolate the second conductive region from the semiconductor substrate.

In some possible implementation manners, the first conductive region is further electrically connected to the at least one conductive layer.

In some possible implementation manners, the at least one conductive layer includes a third conductive layer, and the at least one insulating layer includes a third insulating layer, where the third conductive layer is provided above the semiconductor substrate and in the trench, and located between the first conductive layer and the second conductive layer; and the third insulating layer is provided between the second conductive layer and the third conductive layer to isolate the second conductive region from the third conductive layer and isolate the second conductive region from the semiconductor substrate.

In some possible implementation manners, the second insulting layer and/or the third insulating layer is provided with at least one window, and the second conductive layer is provided in the at least one window so that the second conductive region is electrically connected to the first conductive layer.

In some possible implementation manners, projected areas of the first insulating layer and the first conductive layer on the semiconductor substrate are the same, and projected areas of the second insulating layer and the third conductive layer on the semiconductor substrate are the same.

In some possible implementation manners, projected areas of the first insulating layer and the first conductive layer on the semiconductor substrate are the same, and a projected area of the second insulating layer on the semiconductor substrate is larger than projected areas of the third conductive layer and the third insulating layer on the semiconductor substrate.

In some possible implementation manners, each of the at least one insulating layer includes at least one of:

a silicon oxide layer, a silicon nitride layer, a metal oxide layer, and a metal nitride layer.

Optionally, each of the at least one insulating layer includes at least one of: a silicon dioxide layer, an aluminum oxide layer, a zirconium oxide layer, a silicon nitride layer, a hafnium oxide layer, a lead zirconate titanate ($PbZr_xTi_{1-x}O_3$, PZT) layer, and a calcium copper titanate ($CaCu_3Ti_4O_{12}$, CCTO) layer.

For example, the third insulating layer may be a laminated layer of a material having a high dielectric constant, such as silicon dioxide/aluminum oxide/silicon dioxide ($SiO_2/Al_2O_3/SiO_2$).

Therefore, each of the at least one insulating layer described in the embodiment of the present disclosure may be a laminated layer of a material having a high dielectric constant, so that the capacitor described in the embodiment of the present disclosure has a greater capacitance density.

In some possible implementation manners, each of the at least one conductive layer includes at least one of: a heavily doped polysilicon layer, a carbon-based material layer, a metal layer, and a titanium nitride layer.

Optionally, the above metal layer may be at least one of an aluminum layer, a tungsten layer, and a copper layer.

In a second aspect, a manufacturing method for a capacitor is provided, including:

etching a semiconductor substrate to form at least one trench in the semiconductor substrate, where the trench is formed downward from an upper surface of the semiconductor substrate, and a depth of the trench is less than a thickness of the semiconductor substrate;

depositing a first insulating layer on the upper surface of the semiconductor substrate and an inner surface of the at least one trench;

depositing a first conductive layer on an upper surface and an inner surface of the first insulating layer;

performing photolithography processing on the first insulating layer and the first conductive layer to expose the upper surface of the semiconductor substrate;

depositing a second insulating layer on an upper surface and an inner surface of the first conductive layer and the upper surface of the semiconductor substrate;

performing photolithography processing on the second insulating layer to expose the upper surface of the semiconductor substrate, and forming at least one window on the second insulating layer to expose the upper surface of the first conductive layer, where the second insulating layer covers the first insulating layer and the first conductive layer;

depositing a second conductive layer on an upper surface and an inner surface of the second insulating layer and the upper surface of the semiconductor substrate, and in the at least one window; and performing photolithography processing on the second conductive layer to form a first conductive region and a second conductive region that are independent from each other, where the first conductive region is electrically connected to the semiconductor substrate, and the second conductive region is electrically connected to the first conductive layer.

Therefore, in a manufacturing method for a capacitor provided in an embodiment of the present disclosure, by properly designing a pattern, a second conductive layer is photolithographed into a first conductive region and a second conductive region that are independent from each other, the first conductive region is configured as a first electrode of the capacitor, and the second conductive region is configured as a second electrode of the capacitor, which reduces photolithography steps in a process of capacitor processing, reduces alignment difficulty of multiple photolithography, and improves process reliability.

In some possible implementation manners, the method further includes:

performing photolithography processing on the second conductive region to expose the second insulating layer at a periphery of the second conductive region.

In some possible implementation manners, the etching the semiconductor substrate includes:

etching the semiconductor substrate by deep reactive ion etching (DRIE).

In a third aspect, a manufacturing method for a capacitor is provided, including:

etching a semiconductor substrate to form at least one trench in the semiconductor substrate, where the trench is formed downward from an upper surface of the semiconductor substrate, and a depth of the trench is less than a thickness of the semiconductor substrate;

depositing a first insulating layer on the upper surface of the semiconductor substrate and an inner surface of the at least one trench;

depositing a first conductive layer on an upper surface and an inner surface of the first insulating layer;

performing photolithography processing on the first conductive layer to expose the upper surface of the first insulating layer;

depositing a second insulating layer on an upper surface and an inner surface of the first conductive layer and the upper surface of the first insulating layer;

performing photolithography processing on the first insulating layer and the second insulating layer to expose the upper surface of the semiconductor substrate, and forming at least one window on the second insulating layer to expose the upper surface of the first conductive layer, where the second insulating layer covers the first conductive layer;

depositing a second conductive layer on an upper surface and an inner surface of the second insulating layer and the upper surface of the semiconductor substrate, and in the at least one window; and performing photolithography processing on the second conductive layer to form a first conductive region and a second conductive region that are independent from each other, where the first conductive region is electrically connected to the semiconductor substrate, and the second conductive region is electrically connected to the first conductive layer.

Therefore, in a manufacturing method for a capacitor provided in an embodiment of the present disclosure, by properly designing a pattern, a second conductive layer is photolithographed into a first conductive region and a second conductive region that are independent from each other, the first conductive region is configured as a first electrode of the capacitor, and the second conductive region is configured as a second electrode of the capacitor, which reduces photolithography steps in a process of capacitor processing, reduces alignment difficulty of multiple photolithography, and improves process reliability.

In a fourth aspect, a manufacturing method for a capacitor is provided, including:

etching a semiconductor substrate to form at least one first trench in the semiconductor substrate, where the first trench is formed downward from an upper surface of the semiconductor substrate, and a depth of the first trench is less than or equal to a thickness of the semiconductor substrate;

depositing a first insulating layer on the upper surface of the semiconductor substrate and an inner surface of the at least one trench;

depositing a first conductive layer on an upper surface and an inner surface of the first insulating layer;

performing photolithography processing on the first insulating layer and the first conductive layer to expose the upper surface of the semiconductor substrate;

depositing a second insulating layer on an upper surface and an inner surface of the first conductive layer and the upper surface of the semiconductor substrate;

depositing a third conductive layer on an upper surface and an inner surface of the second insulating layer;

performing photolithography processing on the second insulating layer and the third conductive layer to expose the upper surfaces of the semiconductor substrate and the first conductive layer;

depositing a third insulating layer on an upper surface and an inner surface of the third conductive layer and the upper surface of the semiconductor substrate;

performing photolithography processing on the third insulating layer to expose the upper surfaces of the semiconductor substrate and the third conductive layer, and forming at least one window on the third insulating layer to expose the upper surface of the first conductive layer;

depositing a second conductive layer on an upper surface and an inner surface of the third insulating layer, the upper surface of the third conductive layer and the upper surface of the semiconductor substrate, and in the at least one window; and performing photolithography processing on the second conductive layer to form a first conductive region and a second conductive region that are independent from each other, where the first conductive region is electrically connected to the semiconductor substrate, the first conductive region is further electrically connected to the third conductive layer, and the second conductive region is electrically connected to the first conductive layer.

Therefore, in a manufacturing method for a capacitor provided in an embodiment of the present disclosure, by properly designing a pattern, a second conductive layer is photolithographed into a first conductive region and a second conductive region that are independent from each other, the first conductive region is configured as a first electrode of the capacitor, and the second conductive region is configured as a second electrode of the capacitor, which reduces photolithography steps in a process of capacitor processing, reduces alignment difficulty of multiple photolithography, and improves process reliability.

In some possible implementation manners, the method further includes:

performing photolithography processing on the second conductive region to expose the third insulating layer at a periphery of the second conductive region.

In some possible implementation manners, the etching the semiconductor substrate includes:

etching the semiconductor substrate by DRIE.

DESCRIPTION OF EMBODIMENTS

Figure 1:
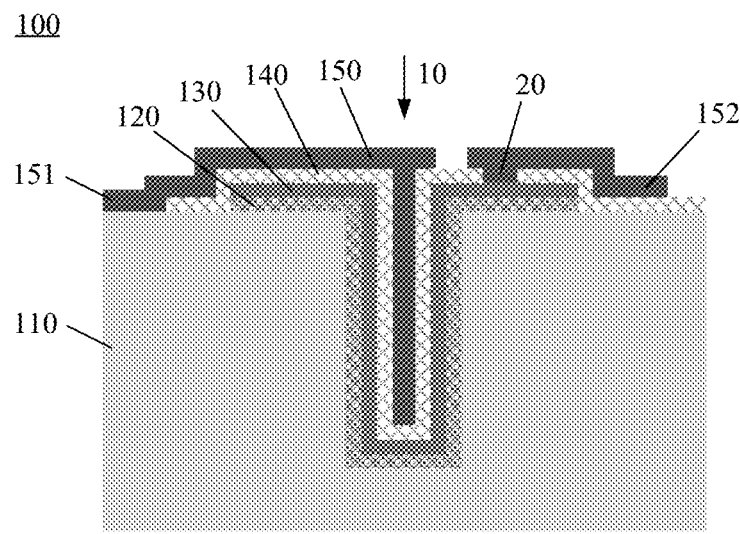
FIG. 1 is a schematic structural diagram of a capacitor according to an embodiment of the present disclosure.

Technical solutions in embodiments of the present disclosure will be described hereinafter with reference to accompanying drawings.

It should be understood that a capacitor of an embodiment of the present disclosure can play a role of bypassing, filtering, decoupling, or the like in a circuit.

The capacitor described in the embodiment of the present disclosure may be a 3D silicon capacitor which is a novel capacitor based on semiconductor wafer processing techniques. Compared with a traditional MLCC (multi-layer ceramic capacitor), the 3D silicon capacitor has advantages of small size, high precision, strong stability, long lifetime, and the like. In a basic processing flow, a 3D structure with a high aspect ratio such as a deep hole, a trench, a pillar shape, a wall shape, or the like is required to be first processed on a wafer or substrate, and then an insulating thin film and a low-resistivity conductive material are deposited on a surface of the 3D structure to manufacture a lower electrode, an dielectric layer and an upper electrode of the capacitor, sequentially.

At the present stage, based on some concepts of multi-layer nesting in the manufacture of a DRAM, the 3D silicon capacitor is manufactured by alternately depositing a conductor and an insulator material on a surface of a 3D structure to form a structure where a plurality of capacitors are vertically stacked, and then connecting all the capacitors in parallel by different connection manners on a front side of a silicon substrate to finally form a capacitor with a large capacitance value. However, the 3D silicon capacitor manufactured by the above manners requires that a photolithography step (including exposure, development, and etching) is performed many times on a front side of a wafer. For example, to manufacture a silicon capacitor with two insulating dielectric layers, the photolithography step is required to be performed at least five times, which requires not only higher pattern alignment accuracy, but also higher cost. In this context, the present disclosure proposes a novel parallel multi-layer 3D capacitor structure and a manufacturing method for the same in order to avoid the above disadvantages.

Hereinafter, a capacitor according to an embodiment of the present disclosure will be introduced in detail with reference to FIGS. 1 to 7.

It should be understood that capacitors in FIGS. 1 to 5 are merely examples, and the number of trenches included in the capacitors is not limited to that included in the capacitors as shown in FIGS. 1 to 5, and may be determined according to actual needs. Meanwhile, in embodiments of FIGS. 1 to 5, description is made by an example that an extending direction of a trench is a direction perpendicular to a semiconductor substrate (wafer). In the embodiments of the present disclosure, the extending direction of the trench may also be some other directions, for example, any direction satisfying that an angle with respect to the direction perpendicular to the semiconductor substrate (wafer) is less than a preset value.

It should be noted that in embodiments shown below, for structures shown in different embodiments, same structures are denoted by same reference numerals for ease of understanding, and detailed description of the same structures is omitted for brevity.

FIG. 1 is a possible structural diagram of a capacitor 100 according to an embodiment of the present disclosure. As shown in FIG. 1, the capacitor 100 includes a semiconductor substrate 110, a first insulating layer 120, a first conductive layer 130, a second insulating layer 140, and a second conductive layer 150.

Specifically, as shown in FIG. 1, in the capacitor 100, the semiconductor substrate 110 includes an upper surface and a lower surface opposite to the upper surface; at least one trench 10 is provided in the semiconductor substrate 110, and the at least one trench 10 is formed downward from the upper surface of the semiconductor substrate 100; the first conductive layer 130 is provided above the semiconductor substrate 110 and in the trench 10; the first insulating layer 120 is provided between the semiconductor substrate 110 and the first conductive layer 130 to isolate the first conductive layer 130 from the semiconductor substrate 110; the second conductive layer 150 is provided above the semiconductor substrate 110 and in the trench 10, and the second conductive layer 150 includes a first conductive region 151 and a second conductive region 152 that are independent from each other, the first conductive region 151 is electrically connected to the semiconductor substrate 110, and the second conductive region 152 is electrically connected to the first conductive layer 130; and the second insulating layer 140 is provided between the first conductive layer 130 and the second conductive layer 150 to isolate the first conductive region 151 from the first conductive layer 130 and isolate the second conductive region 152 from the semiconductor substrate 110.

It should be noted that, in the embodiment of the present disclosure, a size of a cross section of the trench 10 is not limited. For example, the trench 10 may be a hole with a small difference between length and width of the cross section, or a trench with a large difference between length and width. Here, the cross section may be understood as a section parallel to the surfaces of the semiconductor substrate, and FIG. 1 shows a section along a longitudinal direction of the semiconductor substrate.

It should be understood that the insulating layer in the embodiment of the present disclosure may also be referred to as a dielectric layer.

Optionally, in the embodiment of the present disclosure, the second insulating layer 140 is provided with at least one window 20, and the second conductive layer 150 is provided in the at least one window 20 so that the second conductive region 152 is electrically connected to the first conductive layer 130. Specifically, as shown in FIG. 1, the second conductive layer 150 may be provided in the at least one window 20.

It should be noted that the first conductive layer 130 is provided in the at least one window 20, which can also achieve the purpose that the second conductive region 152 is electrically connected to the first conductive layer 130.

It should be understood that the shape and number of the at least one window 20 provided for the second insulating layer 140 may be specifically determined according to manufacturing processes of the capacitor 100, which is not limited in the embodiment of the present disclosure.

Optionally, in the embodiment of the present disclosure, the first conductive region 151 is configured as a first electrode of the capacitor 100, and the second conductive region 152 is configured as a second electrode of the capacitor 100.

It should be noted that the first conductive region 151 and the second conductive region 152 included in the second conductive layer 150 serve as the first electrode and the second electrode of the capacitor 100, respectively, that is, in the manufacturing process of the capacitor 100, two electrodes of the capacitor 100 may be manufactured by performing a photolithography step only once, thereby reducing photolithography steps in the process of capacitor manufacturing, and reducing cost of the capacitor.

In a specific implementation, in the capacitor 100, for example, only one trench 10 is provided, and the semiconductor substrate 110, the first insulating layer 120 and the first conductive layer 130 may constitute a capacitor A (capacitance C1). The first conductive layer 130, the second insulating layer 140, and the second conductive layer 150 (the first conductive region 151) may constitute a capacitor B (capacitance C2). The capacitor A and the capacitor B are connected in parallel, and thus capacitance C of the capacitor 100 may be equivalent capacitance of the capacitor A and the capacitor B in parallel, that is, C=C1+C2. The first conductive region 151 and the second conductive region 152 serve as common electrodes of the two parallel capacitors, respectively.

Optionally, the semiconductor substrate 110 is preferably an n-type or p-type heavily doped low-resistivity silicon wafer. A high-resistivity wafer may also be adopted, but after the trench 10 is produced, the upper surface (front side) of the semiconductor substrate 110 and a surface of the trench 10 are required to be doped to form a heavily doped low-resistivity conductive layer.

In the embodiment of the present disclosure, shapes of cross sections of different trenches 10 of the at least one trench 10 provided in the semiconductor substrate 110 may be the same or different.

It should be noted that in the embodiment of the present disclosure, a depth and a width of the at least one trench 10 may be flexibly set according to actual needs, and depths of different trenches 10 of the at least one trench 10 may be the same or different. In the embodiment of the present disclosure, a thickness of the semiconductor substrate 100 may also be flexibly set according to actual needs. For example, when the thickness of the semiconductor substrate 100 is too thick to meet a requirement, thinning processing may be performed on the semiconductor substrate 110.

Optionally, as shown in FIG. 1, in the embodiment of the present disclosure, the first conductive region 151 and the second conductive region 152 are isolated by air. Certainly, the first conductive region 151 and the second conductive region 152 may also isolated by some insulating materials.

It should be noted that spacing between the first conductive region 151 and the second conductive region 152 may be flexibly set according to actual needs.

Optionally, in the embodiment of the present disclosure, the first insulating layer 120 and/or the second insulating layer 140 includes at least one of: a silicon dioxide layer, a silicon nitride layer, an aluminum oxide layer, a zirconium oxide layer, a hafnium oxide layer, a lead zirconate titanate ($PbZr_xTi_{1-x}O_3$, PZT) layer, and a calcium copper titanate ($CaCu_3Ti_4O_{12}$, CCTO) layer. A specific insulating material and a layer thickness may be adjusted according to requirements of a capacitor, such as a capacitance value, a frequency characteristic, and a loss. Certainly, the first insulating layer 120 and/or the second insulating layer 140 may further include some other material layers having high dielectric constant characteristics, which are not limited in the embodiment of the present disclosure.

For example, the first insulating layer 120 or the second insulating layer 140 may be a laminated layer of a material having a high dielectric constant, such as silicon dioxide/aluminum oxide/silicon dioxide ($SiO_2/Al_2O_3/SiO_2$).

Therefore, the first insulating layer and the second insulating layer described in the embodiment of the present disclosure may be laminated layers of a material having a high dielectric constant, so that the capacitor described in the embodiment of the present disclosure may have a greater capacitance density.

Optionally, in the embodiment of the present disclosure, the first conductive layer 130 and/or the second conductive layer 150 includes at least one of: a heavily doped polysilicon layer, a carbon-based material layer, a metal layer and a titanium nitride layer.

It should be noted that a material of the first conductive layer 130 or the second conductive layer 150 may be heavily doped polysilicon, a carbon-based material, or various metals such as aluminum, tungsten and copper, and may also be a low-resistivity compound such as titanium nitride or a combination of the above several conductive materials.

Optionally, as shown in FIG. 1, in the embodiment of the present disclosure, projected areas of the first insulating layer 120 and the first conductive layer 130 on the semiconductor substrate 110 are the same, and a projected area of the second insulating layer 140 on the semiconductor substrate 110 is larger than the projected area of the first conductive layer 130 on the semiconductor substrate 110.

In other words, the projected area of the second insulating layer 140 on the semiconductor substrate 110 is larger than the projected area of the first conductive layer 130 on the semiconductor substrate 110, that is, that the second insulating layer 140 covers the first insulating layer 120 and the first conductive layer 130 can be achieved, and the purpose of electrically isolating the first conductive layer 130 from the second conductive layer 150 is achieved.

Figure 2:
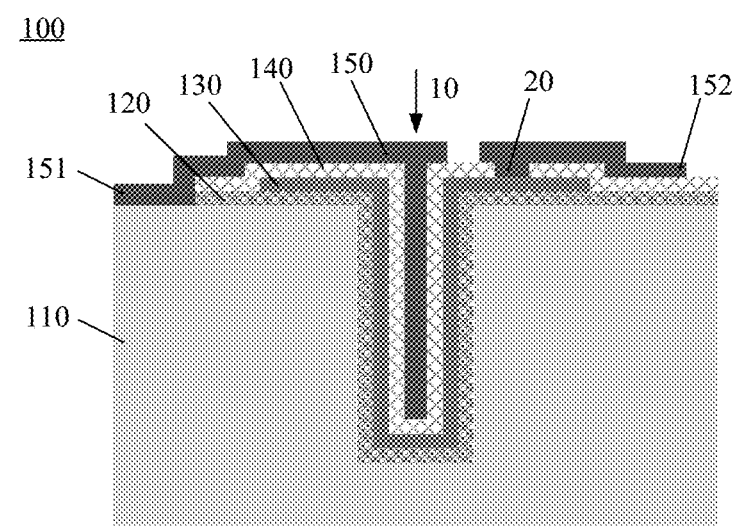
FIG. 2 is a schematic structural diagram of another capacitor according to an embodiment of the present disclosure.

Optionally, as shown in FIG. 2, in the embodiment of the present disclosure, a projected area of the first insulating layer 120 on the semiconductor substrate 110 is larger than a projected area of the first conductive layer 130 on the semiconductor substrate 110, and a projected area of the second insulating layer 140 on the semiconductor substrate 110 is larger than the projected area of the first conductive layer 130 on the semiconductor substrate 110.

Optionally, in the embodiment of the present disclosure, the capacitor 100 may further include at least one conductive layer and at least one insulating layer. Specifically, the at least one conductive layer is provided above the semiconductor substrate and in the trench, and located between the first conductive layer and the second conductive layer; and the at least one insulating layer is provided between different conductive layers of the at least one conductive layer to isolate the at least one conductive layer respectively, and provided between the second conductive layer and the at least one conductive layer to isolate the second conductive region from the at least one conductive layer and isolate the second conductive region from the semiconductor substrate.

Optionally, the number of the at least one conductive layer is the same as that of the at least one insulating layer.

It should be noted that when the at least one conductive layer includes only one conductive layer and the at least one insulating layer includes only one insulating layer, the at least one insulating layer is only provided between the second conductive layer and the at least one conductive layer to isolate the second conductive region from the at least one conductive layer and isolate the second conductive region from the semiconductor substrate.

Optionally, in the embodiment of the present disclosure, the at least one conductive layer includes a third conductive layer 160, and the at least one insulating layer includes a third insulating layer 170. Specifically, as shown in FIG. 3, the third conductive layer 160 is provided above the semiconductor substrate 110 and in the trench 10, and located between the first conductive layer 130 and the second conductive layer 150; the third insulating layer 170 is provided between the second conductive layer 150 and the third conductive layer 160 to isolate the second conductive region 152 from the third conductive layer 160 and the semiconductor substrate 110; and as shown in FIG. 3, the first conductive region 151 is further electrically connected to the third conductive layer 160.

Figure 3:
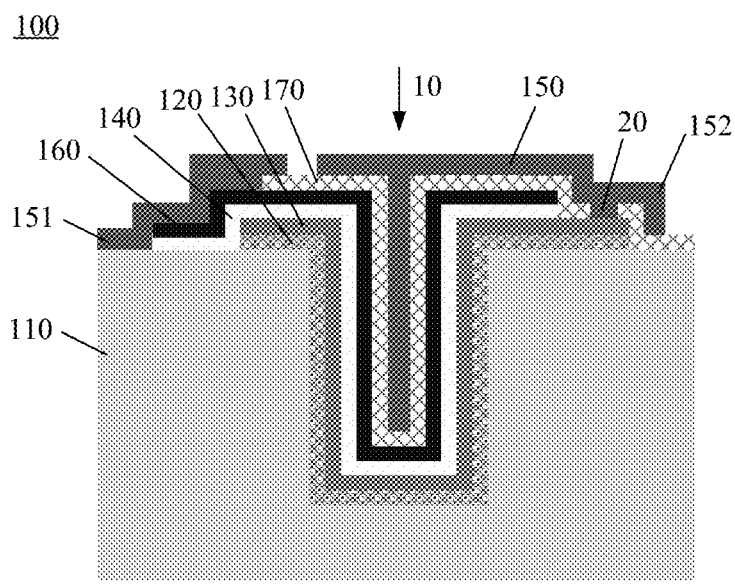
FIG. 3 is a schematic structural diagram of another capacitor according to an embodiment of the present disclosure.

It should be noted that, in a specific implementation, as shown in FIG. 3, in the capacitor 100, the semiconductor substrate 110, the first insulating layer 120 and the first conductive layer 130 may constitute a capacitor C (capacitance C3), the first conductive layer 130, the second insulating layer 140 and the third conductive layer 160 may constitute a capacitor D (capacitance C4), and the third conductive layer 160, the third insulating layer 170 and the second conductive layer 150 (the second conductive region 152) may constitute a capacitor E (capacitance C5). The capacitor C, the capacitor D and the capacitor E are connected in parallel, and capacitance C' of the capacitor 100 may be equivalent capacitance of the capacitor C, the capacitor D and the capacitor E in parallel, that is, $C'=C3+C4+C5$.

Optionally, in the embodiment of the present disclosure, the second insulating layer 140 and/or the third insulating layer 170 is provided with at least one window 20, and the second conductive layer 150 is provided in the at least one window 20 so that the second conductive region 152 is electrically connected to the first conductive layer 130.

As an example, as shown in FIG. 3, the third insulating layer 170 is provided with at least one window 20, and the second conductive layer 150 is provided in the at least one window 20 so that the second conductive region 152 is electrically connected to the first conductive layer 130.

Optionally, in the example shown in FIG. 3, projected areas of the first insulating layer 120 and the first conductive layer 130 on the semiconductor substrate 110 are the same, and projected areas of the second insulating layer 140 and the third conductive layer 160 on the semiconductor substrate 110 are the same.

Therefore, the first insulating layer 120 and the first conductive layer 130 may be formed by one photolithography, and the second insulating layer 140 and the third conductive layer 160 may also be formed by one photolithography.

Figure 4:
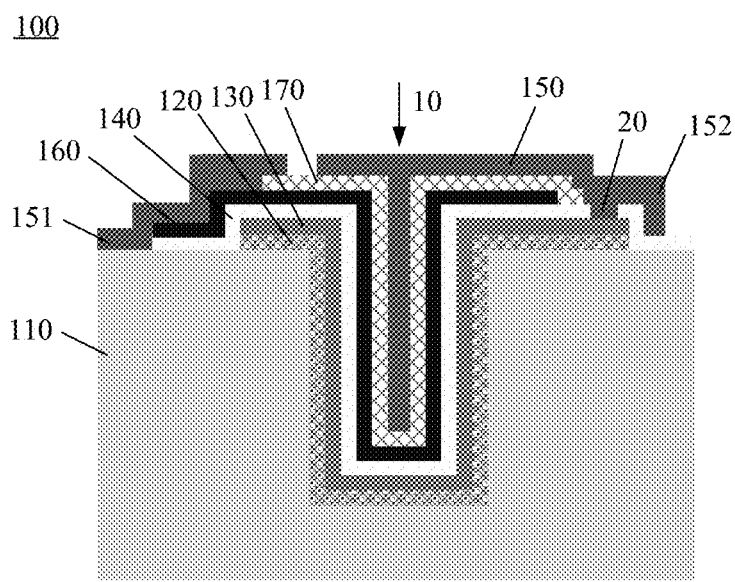
FIG. 4 is a schematic structural diagram of yet another capacitor according to an embodiment of the present disclosure.

As another example, as shown in FIG. 4, the second insulating layer 140 is provided with at least one window 20, and the second conductive layer 150 is provided in the at least one window 20 so that the second conductive region 152 is electrically connected to the first conductive layer 130.

Optionally, in the example shown in FIG. 4, projected areas of the first insulating layer 120 and the first conductive layer 130 on the semiconductor substrate 110 are the same, and a projected area of the second insulating layer 140 on the semiconductor substrate 110 is larger than projected areas of the third conductive layer 160 and the third insulating layer 170 on the semiconductor substrate 110.

Therefore, the first insulating layer 120 and the first conductive layer 130 may be formed by one photolithography.

Figure 5:
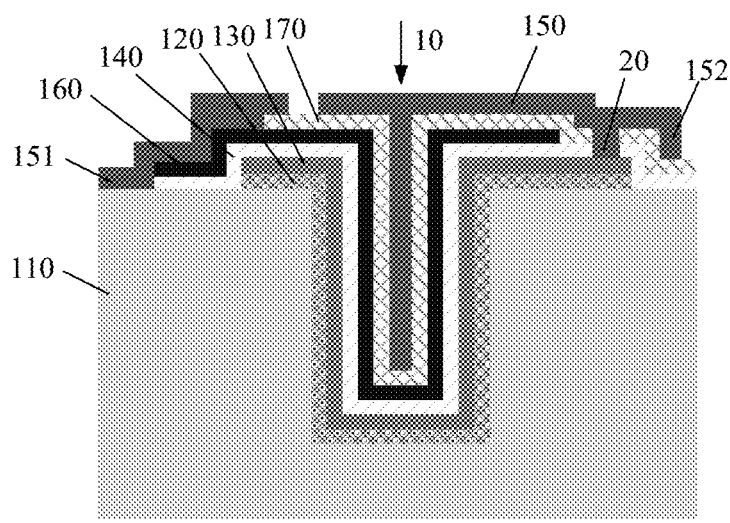
FIG. 5 is a schematic structural diagram of yet another capacitor according to an embodiment of the present disclosure.

For another example, as shown in FIG. 5, the second insulating layer 140 and the third insulating layer 170 are provided with at least one window 20, and the second conductive layer 150 is provided in the at least one window 20 so that the second conductive region 152 is electrically connected to the first conductive layer 130.

Optionally, in the example shown in FIG. 5, projected areas of the first insulating layer 120 and the first conductive layer 130 on the semiconductor substrate 110 are the same, and a projected area of the second insulating layer 140 on the semiconductor substrate 110 is larger than projected areas of the third conductive layer 160 and the third insulating layer 170 on the semiconductor substrate 110.

Therefore, the first insulating layer 120 and the first conductive layer 130 may be formed by one photolithography.

Optionally, in the embodiment of the present disclosure, each of the at least one conductive layer includes at least one of: a heavily doped polysilicon layer, a carbon-based material layer, a metal layer and a titanium nitride layer.

For example, a material of the third conductive layer 160 may be heavily doped polysilicon, a carbon-based material, or various metals such as aluminum, tungsten and copper, and may also be a low-resistivity compound such as titanium nitride, or a combination of the above several conductive materials.

Optionally, in the embodiment of the present disclosure, each of the at least one insulating layer includes at least one of: a silicon dioxide layer, a silicon nitride layer, an aluminum oxide layer, a zirconium oxide layer, a hafnium oxide layer, a lead zirconate titanate ($PbZr_xTi_{1-x}O_3$, PZT) layer, and a calcium copper titanate ($CaCu_3Ti_4O_{12}$, CCTO) layer. A specific insulating material and a layer thickness may be adjusted according to requirements of a capacitor, such as a capacitance value, a frequency characteristic, and a loss. Certainly, each of the at least one insulating layer may further include some other material layers having high dielectric constant characteristics, which are not limited in the embodiment of the present disclosure.

For example, the third insulating layer 170 may be a laminated layer of a material having a high dielectric constant, such as silicon dioxide/aluminum oxide/silicon dioxide ($SiO_2/Al_2O_3/SiO_2$).

Therefore, each of the at least one insulating layer described in the embodiment of the present disclosure may be a laminated layer of a material having a high dielectric constant, so that the capacitor described in the embodiment of the present disclosure may have a greater capacitance density.

Figure 6:
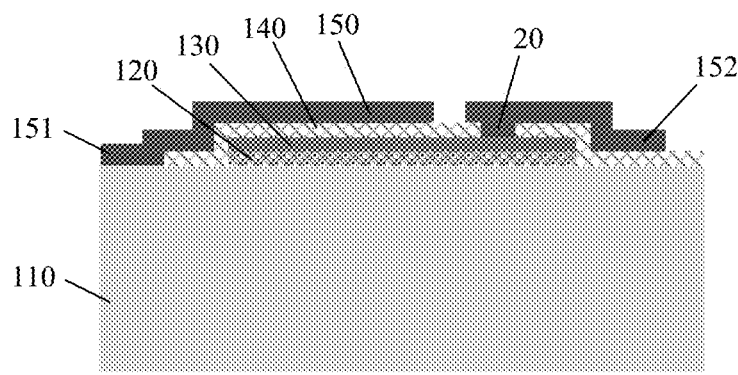
FIG. 6 is a schematic structural diagram of yet another capacitor according to an embodiment of the present disclosure.
Figure 7:
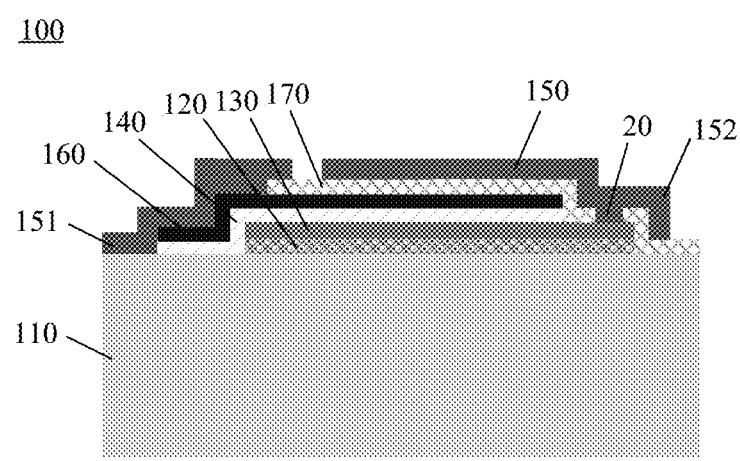
FIG. 7 is a schematic structural diagram of yet another capacitor according to an embodiment of the present disclosure.

Optionally, in the embodiment of the present disclosure, the capacitor 100 may not include a trench structure. For example, the capacitor 100 may be a structure as shown in FIG. 6 or FIG. 7. In this case, the semiconductor substrate 110 may be replaced with a conductive layer, and its specific structure will not be elaborated here.

Hereinafter, manufacturing methods for a capacitor according to embodiments of the present disclosure will be introduced in detail with reference to FIGS. 8 to 11.

Figure 8:
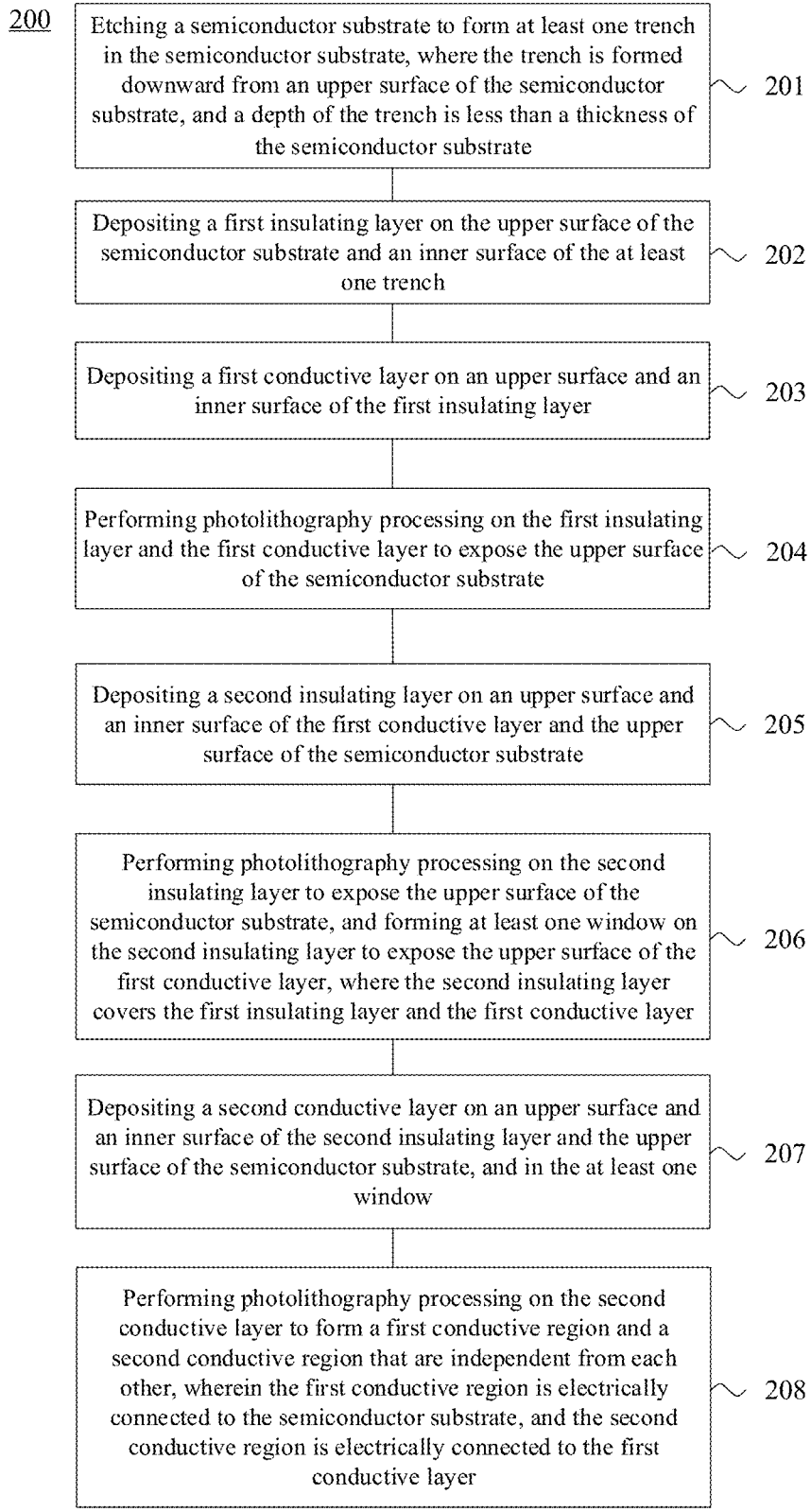
FIG. 8 is a schematic flow chart of a manufacturing method for a capacitor according to an embodiment of the present disclosure.
Figure 10:
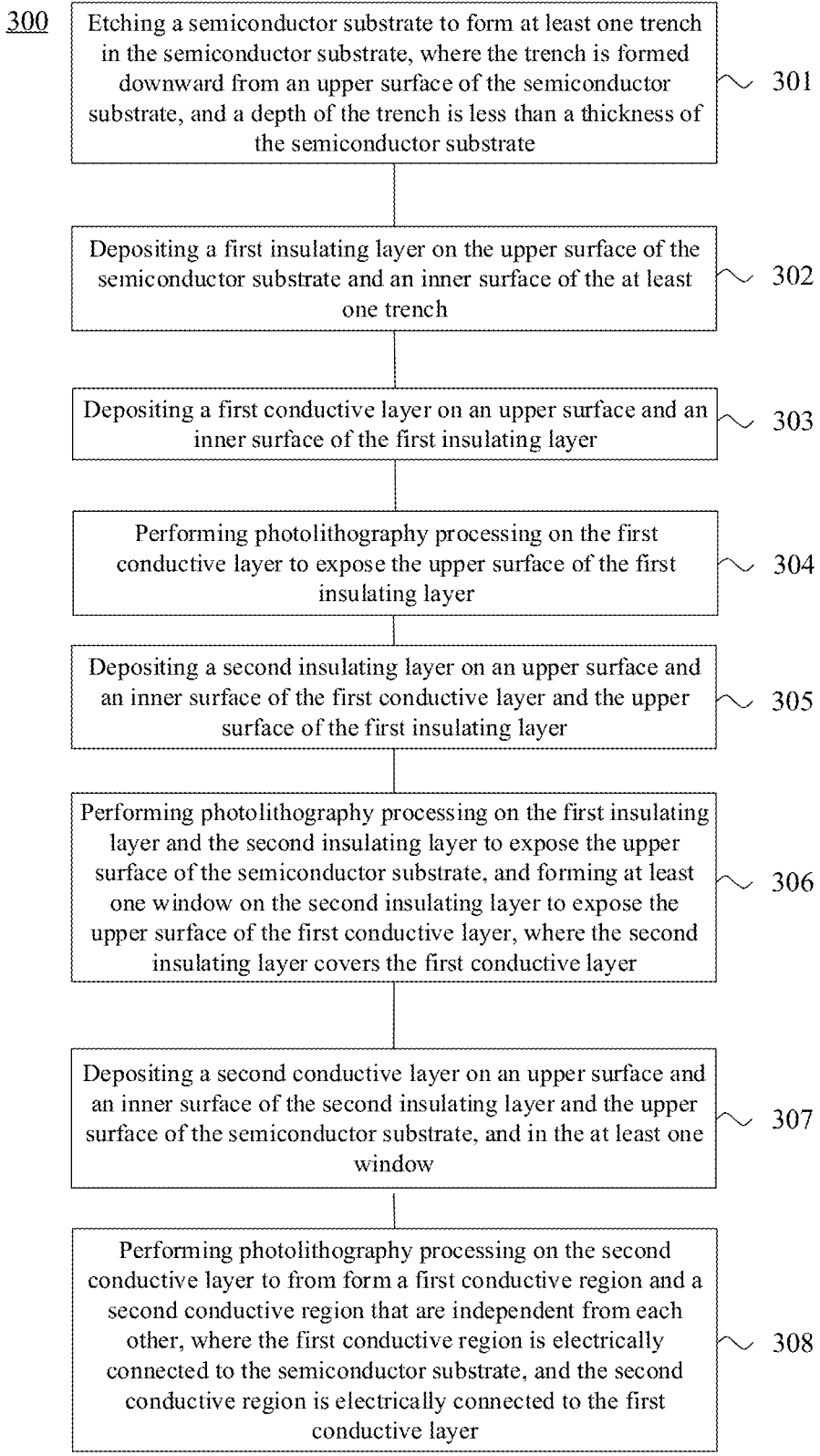
FIG. 10 is a schematic flow chart of another manufacturing method for a capacitor according to an embodiment of the present disclosure.
Figure 11:
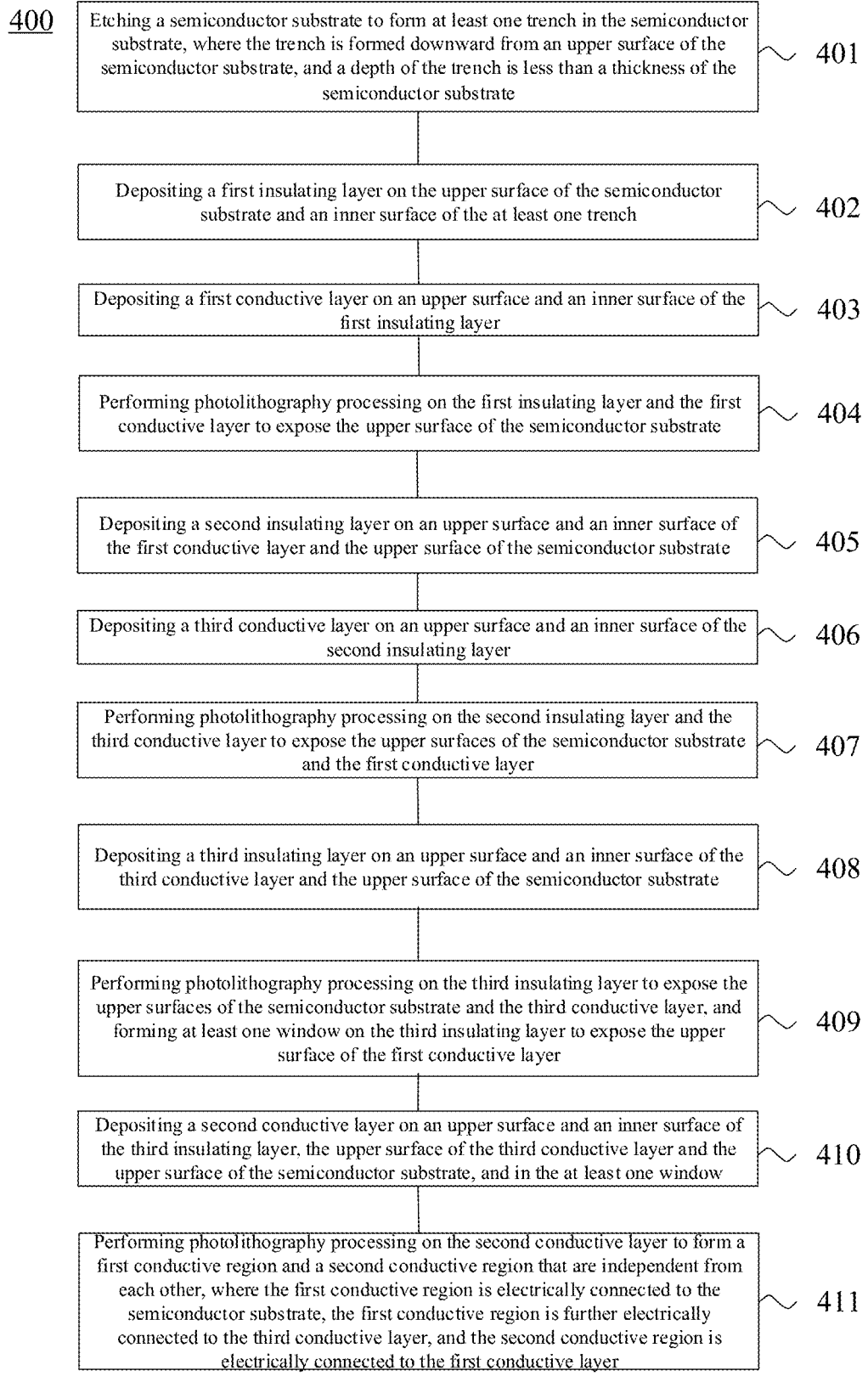
FIG. 11 is a schematic flow chart of yet another manufacturing method for a capacitor according to an embodiment of the present disclosure.

It should be understood that FIGS. 8, 10 and 11 are schematic flow charts of manufacturing methods for a capacitor according to embodiments of the present disclosure, but these steps or operations are merely examples, and other operations or variations of various operations in FIGS. 8, 10 and 11 may also be performed in the embodiments of the present disclosure.

FIG. 8 illustrates a schematic flow chart of a manufacturing method 200 for a capacitor according to an embodiment of the present disclosure. As shown in FIG. 8, the manufacturing method 200 for a capacitor includes the following steps.

Step 201, a semiconductor substrate 110 is etched to form at least one trench 10 in the semiconductor substrate 110, where the trench 10 is formed downward from an upper surface of the semiconductor substrate 110, and a depth of the trench 10 is less than a thickness of the semiconductor substrate 110.

Optionally, the semiconductor substrate 110 may be etched according to deep reactive ion etching to form at least one trench 10 in the semiconductor substrate 110.

Figure 9A:
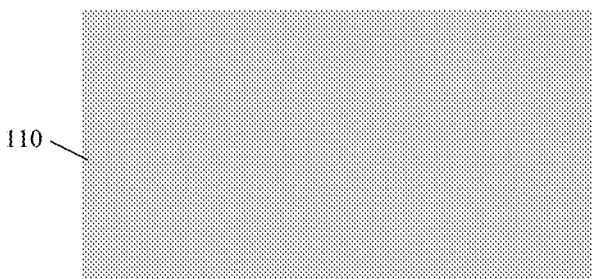
FIGS. 9a to 9O are schematic diagrams of a manufacturing method for a capacitor according to an embodiment of the present disclosure.
Figure 9B:
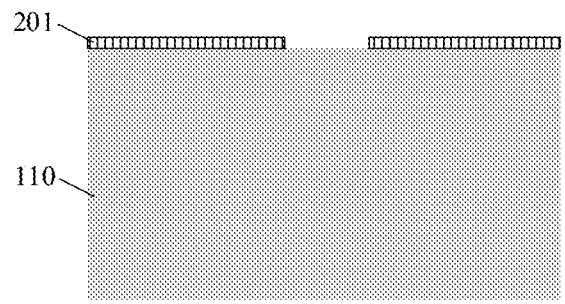
Figure 9C:
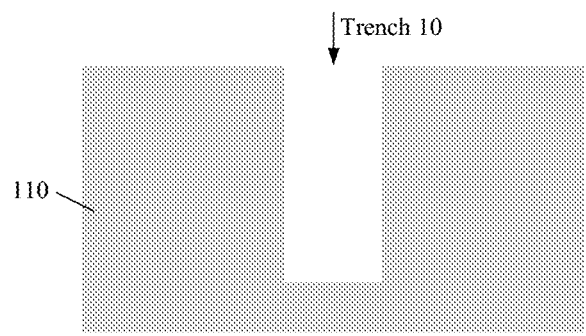

Specifically, first, a layer of photoresist 201 is spin-coated on an upper surface (front side) of a semiconductor substrate 110 as shown in FIG. 9a, and after exposure and development, an etched pattern window not covered with the photoresist is formed, as shown in FIG. 9b. Next, at least one trench 10 is produced in the semiconductor substrate 110 by deep reactive ion etching. The trench 10 extends downward from the upper surface of the semiconductor substrate 110, and a depth of the trench 10 is less than a thickness of the semiconductor substrate 110, as shown in FIG. 9c.

It should be understood that after etching the at least one trench 10, the photoresist 201 is removed.

Step 202, a first insulating layer 120 is deposited on the upper surface of the semiconductor substrate 110 and an inner surface of the at least one trench 10.

Figure 9D:
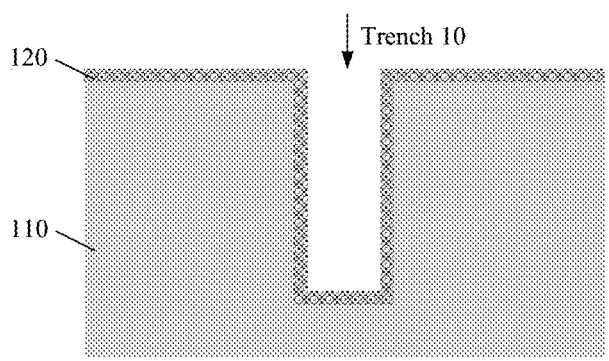

Specifically, an insulating material is deposited in the at least one trench 10 to form the first insulating layer 120, as shown in FIG. 9d.

For example, silicon dioxide is deposited (grown) as the first insulating layer 120 on the upper surface of the semiconductor substrate and the inner surface of the at least one trench by means of thermal oxidation. For another example, a silicon nitride or a silicon oxide, such as undoped silicon glass (USG) or silicon dioxide converted by tetraethyl orthosilicate (TEOS), is grown by means of physical vapor deposition (PVD) or chemical vapor deposition (CVD), and used as the first insulating layer 120. For another example, calcium copper titanate ($CaCu_3Ti_4O_{12}$, CCTO) is grown by an atomic layer deposition (ALD) process. For example, at least one titanium dioxide ($TiO_2$) layer, at least one copper oxide (CuO) layer and at least one calcium oxide (CaO) or calcium carbonate ($CaCO_3$) layer are deposited on the upper surface of the semiconductor substrate and the inner surface of the at least one trench by means of the ALD process to obtain a layered deposition structure, and then the above layered deposition structure is placed in an oxygen-containing atmosphere for high-temperature annealing treatment to obtain a calcium copper titanate thin film as the first insulating layer 120. For another example, various types of polymers by spraying or spin-coating, such as polyimide, parylene, benzocyclobutene (BCB), or the like, are used as the first insulating layer 120. For another example, the first insulating layer 120 may also be spin on glass (SOG), that is, amorphous phase silicon oxide obtained by spin-coating or spraying a silicide-containing solution on a silicon wafer, then performing heating to remove a solvent, and conducting curing. In view of processing effect and cost, silicon dioxide may be selectively grown as the first insulating layer 120 by means of thermal oxidation.

It should be noted that a material of the first insulating layer 120 includes a silicon oxide, a silicon nitride, a metal oxide, a metal nitride, or the like, such as silicon dioxide, silicon nitride, aluminum oxide, aluminum nitride, hafnium oxide, zirconium oxide, zinc oxide, titanium dioxide, calcium copper titanate, lead zirconate titanate, or the like. The first insulating layer 120 may be single-layered, or two or multi-layered. A specific material and a layer thickness may be adjusted according to requirements of a capacitor, such as a capacitance value, a frequency characteristic, and a loss.

Step 203, a first conductive layer 130 is deposited on an upper surface and an inner surface of the first insulating layer 120.

Figure 9E:
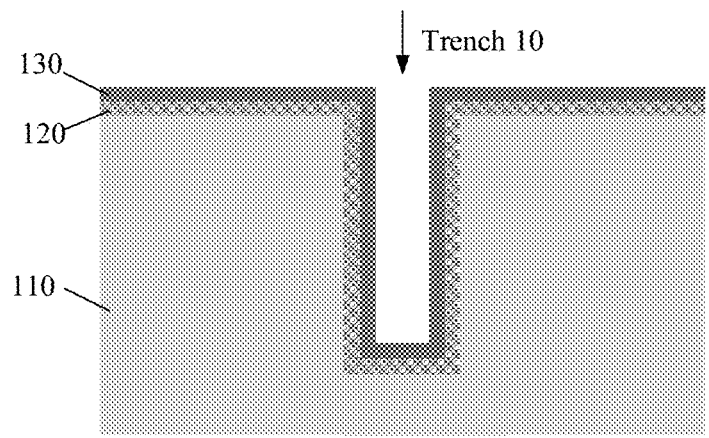

Specifically, in a structure as shown in FIG. 9d, a conductive material is deposited on an upper surface and an inner surface of the first insulating layer 120 to form the first conductive layer 130, as shown in FIG. 9e.

It should be noted that, the method of depositing the first conductive layer 130 includes ALD, PVD, metal-organic chemical vapor deposition, evaporation, electroplating, or the like. A conductive material of the first conductive layer 130 may be heavily doped polysilicon, a carbon-based material, or various metals such as aluminum, tungsten and copper, and may also be a low-resistivity compound such as titanium nitride, or a combination of the above several conductive materials. The first conductive layer 130 includes at least one of: a heavily doped polysilicon layer, a carbon-based material layer, a metal layer, and a titanium nitride layer.

Step 204, photolithography processing is performed on the first insulating layer 120 and the first conductive layer 130 to expose the upper surface of the semiconductor substrate 110.

Figure 9F:
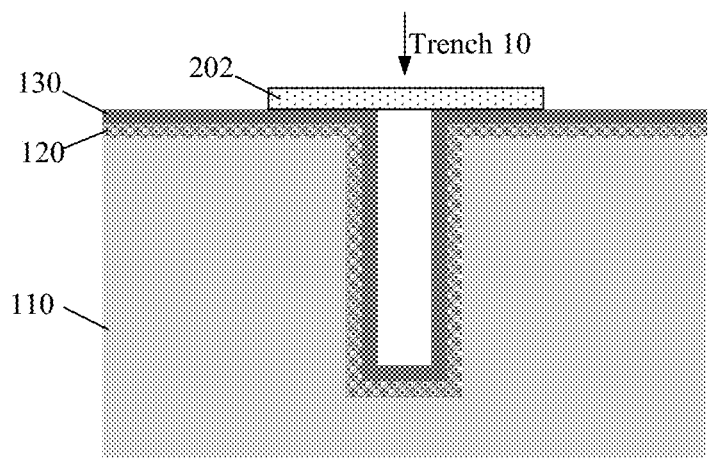
Figure 9G:
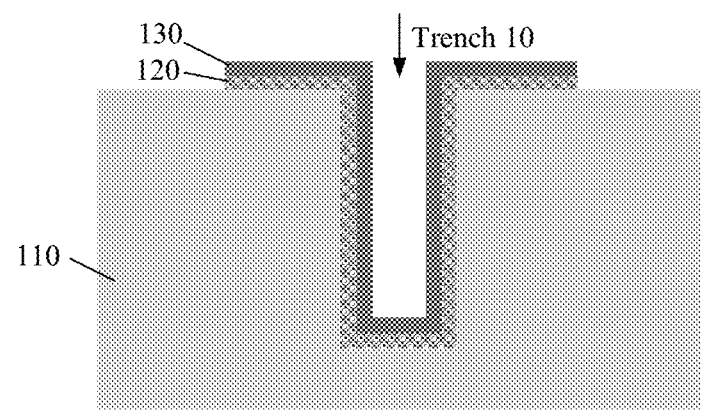

Specifically, first, an upper surface of a structure as shown in FIG. 9e is covered with a layer of photosensitive dry film 202, and after exposure and development, a dry film protection layer covering the first insulating layer 120 and the first conductive layer 130 is formed, as shown in FIG. 9f. Next, the first insulating layer 120 and the first conductive layer 130 not covered with the photosensitive dry film 202 are removed by dry etching. Finally, the photosensitive dry film 202 is removed to obtain a pattern of the first insulating layer 120 and the first conductive layer 130 as shown in FIG. 9g. In this step, the pattern of the first insulating layer 120 and the first conductive layer 130 required remains, and excess portions of the first insulating layer 120 and the first conductive layer 130 are removed to expose the upper surface of the semiconductor substrate 110. It should be understood that the pattern shape of the first insulating layer 120 and the first conductive layer 130 remained may be designed according to capacitor specification requirements, and description will not be elaborated here.

Step 205, a second insulating layer 140 is deposited on an upper surface and an inner surface of the first conductive layer 130 and the upper surface of the semiconductor substrate 110.

Figure 9H:
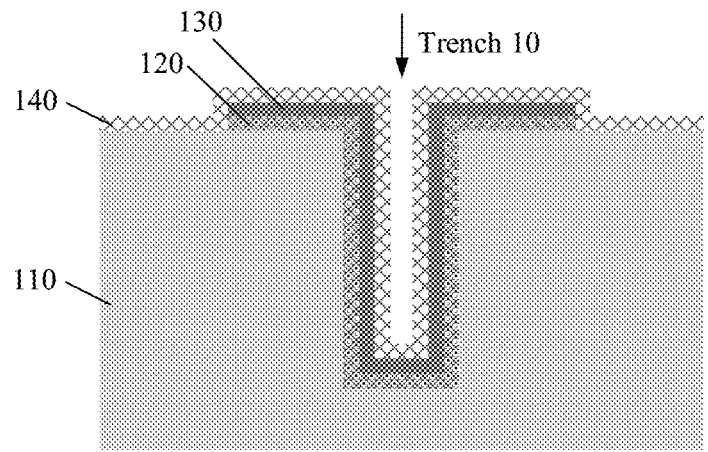

Specifically, in a structure as shown in FIG. 9g, an insulating material is deposited on an upper surface and an inner surface of the first conductive layer 130 and the upper surface of the semiconductor substrate 110 to form the second insulating layer 140, as shown in FIG. 9h.

It should be noted that, the second insulating layer 140 may refer to the related description of the first insulating layer 120. For brevity, details are not described herein again.

Step 206, photolithography processing is performed on the second insulating layer 140 to expose the upper surface of the semiconductor substrate 110, and at least one window 20 is formed on the second insulating layer 140 to expose the upper surface of the first conductive layer 130, where the second insulating layer 140 covers the first insulating layer 120 and the first conductive layer 130.

Figure 9I:
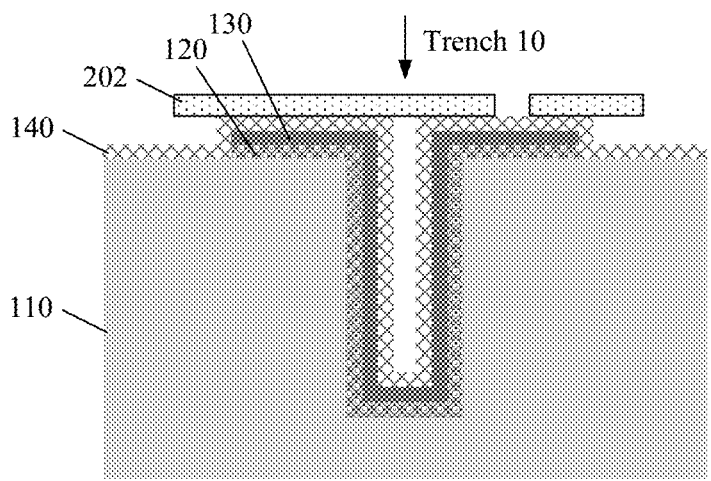
Figure 9J:
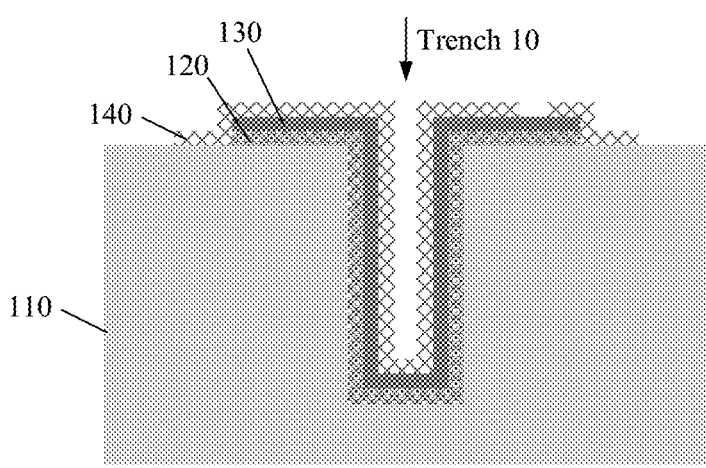

Specifically, first, an upper surface of a structure as shown in FIG. 9h is covered with a layer of photosensitive dry film 202, and after exposure and development, a dry film protection layer covering the second insulating layer 140 is formed, as shown in FIG. 9i. Next, the second insulating layer 140 not covered with the photosensitive dry film is removed by dry etching. Finally, the photosensitive dry film 202 is removed to obtain a pattern of the second insulating layer 140 as shown in FIG. 9j. Similarly, the second insulating layer 140 in this step remains in a predetermined pattern region, and excess portions of the second insulating layer 140 are removed to expose the semiconductor substrate 110 and the first conductive layer 130 corresponding to the portions. It should be understood that the pattern shape of the second insulating layer 140 remained may be designed according to capacitor specification requirements, and description will not be elaborated here.

Step 207, a second conductive layer 150 is deposited on an upper surface and an inner surface of the second insulating layer 140 and the upper surface of the semiconductor substrate 110, and in the at least one window 20.

Figure 9K:
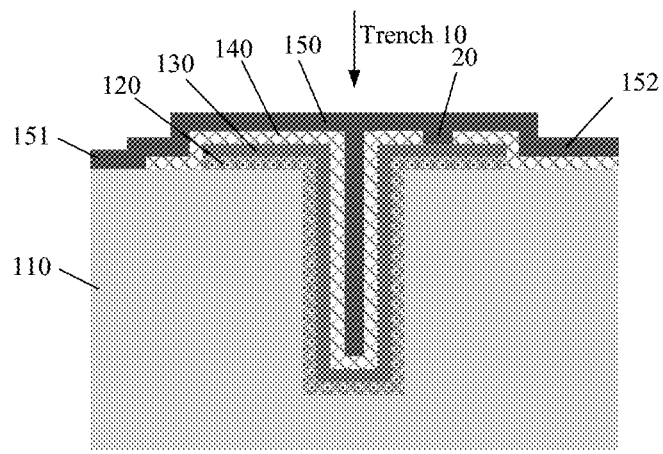

Specifically, in a structure as shown in FIG. 9j, a conductive material is deposited on an upper surface and an inner surface of the second insulating layer 140 and the upper surface of the semiconductor substrate 110, and in the at least one window 20 to form the second conductive layer 150, as shown in FIG. 9k.

It should be noted that the second conductive layer 150 may refer to the related description of the first conductive layer 130. For brevity, details are not described herein again.

Step 208, photolithography processing is performed on the second conductive layer 150 to form a first conductive region 151 and a second conductive region 152 that are independent from each other, where the first conductive region 151 is electrically connected to the semiconductor substrate 110, and the second conductive region 152 is electrically connected to the first conductive layer 130.

Figure 9L:
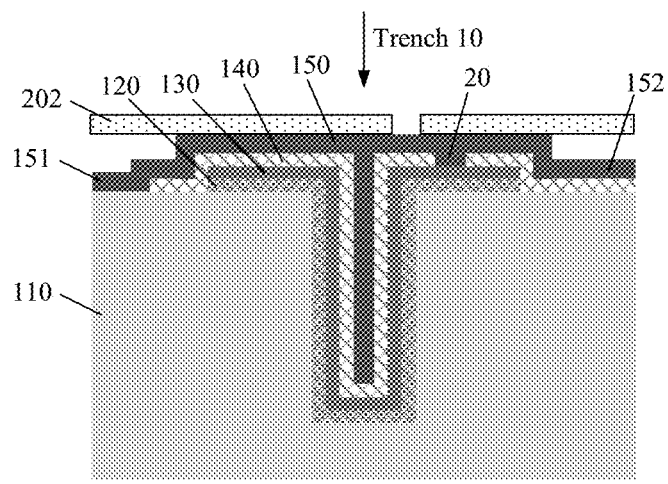
Figure 9M:
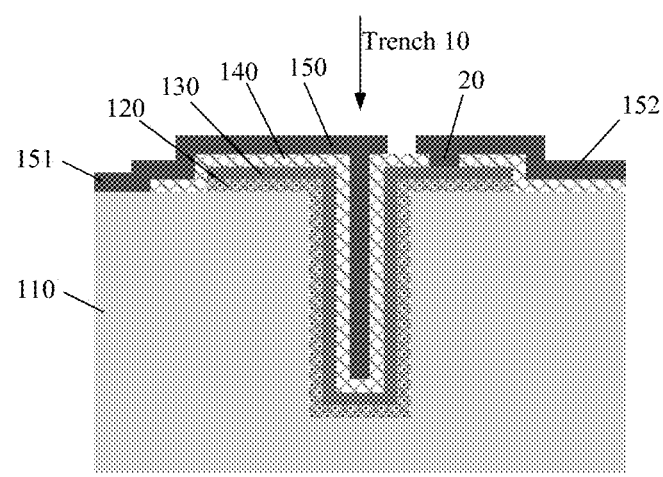

Specifically, first, an upper surface of a structure as shown in FIG. 9k is covered with a layer of photosensitive dry film 202, and after exposure and development, a dry film protection layer covering the second conductive layer 150 is formed, as shown in FIG. 9l. Next, the second conductive layer 150 not covered with the photosensitive dry film is removed by dry etching. Finally, the photosenstive dry film 202 is removed to obtain a pattern of the second conductive layer 150 as shown in FIG. 9m. In FIG. 9m, a first conductive region 151 and a second conductive region 152 that are independent from each other are formed, the first conductive region 151 is electrically connected to the semiconductor substrate 110, and the second conductive region 152 is electrically connected to the first conductive layer 130. Similarly, the second insulating layer 150 in this step remains in a predetermined pattern region, and an excess portion of the second insulating layer 150 is removed to form a first conductive region 151 and a second conductive region 152 that are independent from each other. It should be understood that the pattern shape of the second conductive layer 150 remained may be designed according to capacitor specification requirements, and description will not be elaborated here.

It should be understood that an upper surface of each material layer in steps 202-208 refers to a surface of the material layer substantially parallel to the upper surface of the semiconductor substrate, and an inner surface of each material layer refers to an upper surface of the material layer in the trench. The upper surface and the inner surface may be regarded as a whole.

It should be noted that the first conductive region 151 may be configured as a first electrode of the capacitor, and the second conductive region 152 may be configured as a second electrode of the capacitor. That is, the manufacturing method 200 for a capacitor may manufacture the capacitor as shown in FIG. 1.

It should be noted that in the above step 204, photolithography processing is performed on the first insulating layer and the first conductive layer, that is, photolithography processing is performed on the first insulating layer and the first conductive layer simultaneously, which could reduce photolithography steps. Further, the first conductive region and the second conductive region included in the second conductive layer serve as the first electrode and the second electrode of the capacitor, respectively, that is, in the manufacturing process of the capacitor, two electrodes of the capacitor may be manufactured by performing a photolithography step only once, thereby reducing photolithography steps in the process of capacitor manufacturing, and reducing cost of the capacitor.

Optionally, the method 200 further includes:

performing photolithography processing on the second conductive region 152 to expose the second insulating layer 140 at a periphery of the second conductive region 152.

Figure 9N:
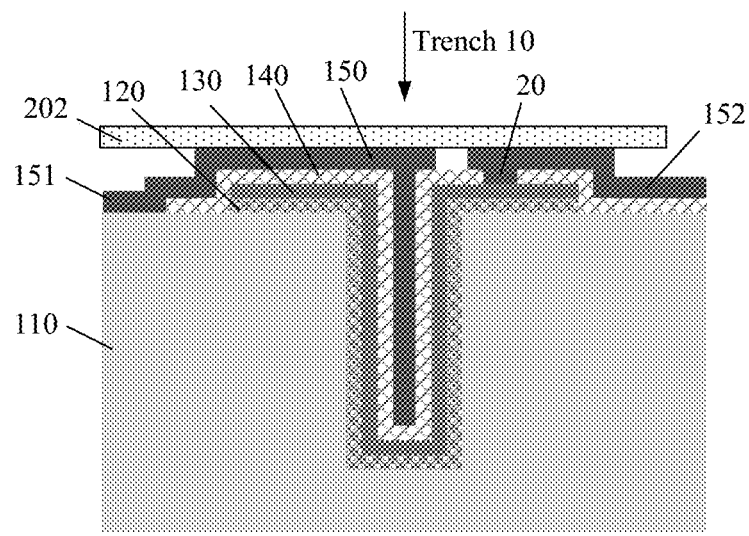
Figure 9O:
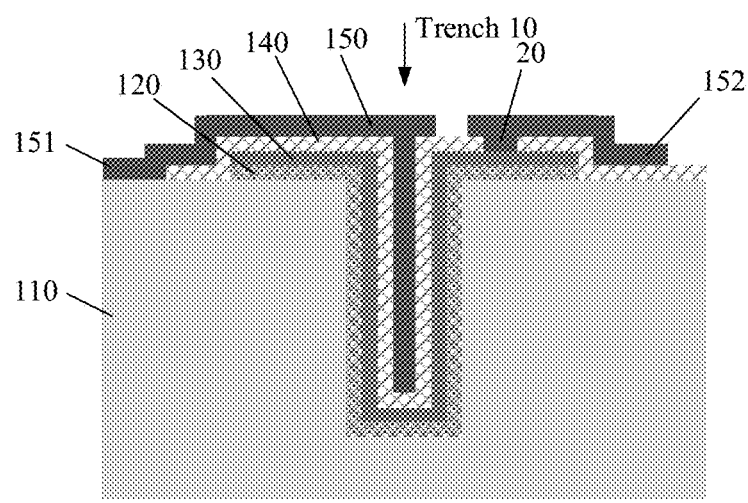

Specifically, first, an upper surface of a structure as shown in FIG. 9m is covered with a layer of photosensitive dry film 202, and after exposure and development, a dry film protection layer covering the second conductive layer 150 is formed, as shown in FIG. 9n. Next, the second conductive layer 150 not covered with the photosensitive dry film is removed by dry etching. Finally, the photosensitive dry film 202 is removed to obtain a pattern of the second insulating layer 150 as shown in FIG. 9o. Similarly, the second insulating layer 150 in this step remains in a predetermined pattern region, and an excess portion of the second insulating layer 150 is removed to expose the second insulating layer 140 at a periphery of the second conductive region 152. It should be understood that the pattern shape of the second conductive layer 150 remained may be designed according to capacitor specification requirements, and description will not be elaborated here.

Optionally, this step may also be implemented in step 208. That is, in step 208, photolithography processing is performed on the second conductive layer 150 to not only form a first conductive region 151 and a second conductive region 152 that are independent from each other, but expose the second insulating layer 140 at a periphery of the second conductive region 152.

It should be noted that the second insulating layer 140 is exposed at the periphery of the second conductive region 152, which could avoid electrical connection between the second conductive region 152 and the semiconductor substrate 110.

It should be understood that the manufacturing method 200 of a capacitor shown in FIG. 8 and FIG. 9 is exemplified by etching one trench, and other numbers of trenches may also be etched, which is not limited in the embodiment of the present disclosure. A plurality of trenches may be formed in the same process, that is, the plurality of trenches and filling materials such as an insulating layer and a conductive layer in the trenches may be formed synchronously. Certainly, the capacitor without a trench as shown in FIG. 6 may also be manufactured based on the above manufacturing method for a capacitor, and description will not be elaborated here.

Therefore, in a manufacturing method for a capacitor provided in an embodiment of the present disclosure, by properly designing a pattern, a second conductive layer is photolithographed into a first conductive region and a second conductive region that are independent from each other, the first conductive region is configured as a first electrode of the capacitor, and the second conductive region is configured as a second electrode of the capacitor, which reduces photolithography steps in a process of capacitor processing, reduces alignment difficulty of multiple photolithography, and improves process reliability.

FIG. 10 illustrates a schematic flow chart of a manufacturing method 300 for a capacitor according to an embodiment of the present disclosure. As shown in FIG. 10, the manufacturing method 300 for a capacitor includes:

step 301, etching a semiconductor substrate to form at least one trench in the semiconductor substrate, where the trench is formed downward from an upper surface of the semiconductor substrate, and a depth of the trench is less than a thickness of the semiconductor substrate;

step 302, depositing a first insulating layer on the upper surface of the semiconductor substrate and an inner surface of the at least one trench;

step 303, depositing a first conductive layer on an upper surface and an inner surface of the first insulating layer;

step 304, performing photolithography processing on the first conductive layer to expose the upper surface of the first insulating layer;

step 305, depositing a second insulating layer on an upper surface and an inner surface of the first conductive layer and the upper surface of the first insulating layer;

step 306, performing photolithography processing on the first insulating layer and the second insulating layer to expose the upper surface of the semiconductor substrate, and forming at least one window on the second insulating layer to expose the upper surface of the first conductive layer, where the second insulating layer covers the first conductive layer;

step 307, depositing a second conductive layer on an upper surface and an inner surface of the second insulating layer and the upper surface of the semiconductor substrate, and in the at least one window; and step 308, performing photolithography processing on the second conductive layer to form a first conductive region and a second conductive region that are independent from each other, where the first conductive region is electrically connected to the semiconductor substrate, and the second conductive region is electrically connected to the first conductive layer.

It should be noted that in the above step 306, photolithography processing is performed on the first insulating layer and the second insulating layer, that is, photolithography processing is performed on the first insulating layer and the second insulating layer simultaneously, which could reduce photolithography steps. Further, the first conductive region and the second conductive region included in the second conductive layer serve as a first electrode and a second electrode of the capacitor, respectively, that is, in the manufacturing process of the capacitor, two electrodes of the capacitor may be manufactured by performing a photolithography step only once, thereby reducing photolithography steps in the process of capacitor manufacturing, and reducing cost of the capacitor.

Optionally, the manufacturing method 300 for a capacitor further includes:

performing photolithography processing on the second conductive region to expose the second insulating layer at a periphery of the second conductive region.

It should be understood that the second insulating layer is exposed at the periphery of the second conductive region, which could avoid electrical connection between the second conductive region and the semiconductor substrate.

It should be noted that the first conductive region may be configured as a first electrode of the capacitor, and the second conductive region may be configured as a second electrode of the capacitor.

Specifically, the manufacturing method 300 for a capacitor mainly differs from the manufacturing method 200 for a capacitor in performing photolithography processing on a first conductive layer separately and performing photolithography processing on a first insulating layer and a second insulating layer simultaneously, and the capacitor as shown in FIG. 2 may be manufactured based on the manufacturing method 300 of the capacitor.

It should be understood that the steps in the manufacturing method 300 for a capacitor may refer to the corresponding steps in the manufacturing method 200 for a capacitor. For brevity, details are not described herein again.

Therefore, in a manufacturing method for a capacitor provided in an embodiment of the present disclosure, by properly designing a pattern, a second conductive layer is photolithographed into a first conductive region and a second conductive region that are independent from each other, the first conductive region is configured as a first electrode of the capacitor, and the second conductive region is configured as a second electrode of the capacitor, which reduces photolithography steps in a process of capacitor processing, reduces alignment difficulty of multiple photolithography, and improves process reliability.

FIG. 11 illustrates a schematic flow chart of a manufacturing method 400 for a capacitor according to an embodiment of the present disclosure. As shown in FIG. 11, the manufacturing method 400 for a capacitor includes:

step 401, etching a semiconductor substrate to form at least one trench in the semiconductor substrate, where the trench is formed downward from an upper surface of the semiconductor substrate, and a depth of the trench is less than or equal to a thickness of the semiconductor substrate;

step 402, depositing a first insulating layer on the upper surface of the semiconductor substrate and an inner surface of the at least one trench;

step 403, depositing a first conductive layer on an upper surface and an inner surface of the first insulating layer;

step 404, performing photolithography processing on the first insulating layer and the first conductive layer to expose the upper surface of the semiconductor substrate;

step 405, depositing a second insulating layer on an upper surface and an inner surface of the first conductive layer and the upper surface of the semiconductor substrate;

step 406, depositing a third conductive layer on an upper surface and an inner surface of the second insulating layer;

step 407, performing photolithography processing on the second insulating layer and the third conductive layer to expose the upper surfaces of the semiconductor substrate and the first conductive layer;

step 408, depositing a third insulating layer on an upper surface and an inner surface of the third conductive layer and the upper surface of the semiconductor substrate;

step 409, performing photolithography processing on the third insulating layer to expose the upper surfaces of the semiconductor substrate and the third conductive layer, and forming at least one window on the third insulating layer to expose the upper surface of the first conductive layer;

step 410, depositing a second conductive layer on an upper surface and an inner surface of the third insulating layer, the upper surface of the third conductive layer and the upper surface of the semiconductor substrate, and in the at least one window; and step 411, performing photolithography processing on the second conductive layer to form a first conductive region and a second conductive region that are independent from each other, where the first conductive region is electrically connected to the semiconductor substrate, the first conductive region is further electrically connected to the third conductive layer, and the second conductive region is electrically connected to the first conductive layer.

It should be noted that in the above step 404, photolithography processing is performed on the first insulating layer and the first conductive layer, that is, photolithography processing is performed on the first insulating layer and the first conductive layer simultaneously, which could reduce photolithography steps. Similarly, in the above step 407, photolithography processing is performed on the second insulating layer and the third conductive layer, which could also reduce photolithography steps. Further, the first conductive region and the second conductive region included in the second conductive layer serve as a first electrode and a second electrode of the capacitor, respectively, that is, in the manufacturing process of the capacitor, two electrodes of the capacitor may be manufactured by performing a photolithography step only once, thereby reducing photolithography steps in the process of capacitor manufacturing, and reducing cost of the capacitor.

Optionally, the manufacturing method 400 for a capacitor further includes:

performing photolithography processing on the second conductive region to expose the third insulating layer at a periphery of the second conductive region.

It should be understood that the third insulating layer is exposed at the periphery of the second conductive region, which could avoid electrical connection between the second conductive region and the semiconductor substrate.

It should be noted that the first conductive region may be configured as a first electrode of the capacitor, and the second conductive region may be configured as a second electrode of the capacitor.

Specifically, the manufacturing method 400 for a capacitor mainly differs from the manufacturing method 200 for a capacitor in depositing a third conductive layer and a third insulating layer after depositing a second insulating layer, and then depositing a second conductive layer, and the capacitor as shown in FIG. 3 may be manufactured based on the manufacturing method 400 for a capacitor. Certainly, the capacitor as shown in FIG. 4 or FIG. 5 and the capacitor without a trench as shown in FIG. 7 may also be manufactured based on the above manufacturing method for a capacitor, and description will not be elaborated here.

It should be understood that the steps in the manufacturing method 400 for a capacitor may refer to the corresponding steps in the manufacturing method 200 for a capacitor. For brevity, details are not described herein again.

Therefore, in a manufacturing method for a capacitor provided in an embodiment of the present disclosure, by properly designing a pattern, a second conductive layer is photolithographed into a first conductive region and a second conductive region that are independent from each other, the first conductive region is configured as a first electrode of the capacitor, and the second conductive region is configured as a second electrode of the capacitor, which reduces photolithography steps in a process of capacitor processing, reduces alignment difficulty of multiple photolithography, and improves process reliability.

A manufacturing method for a capacitor according to the present disclosure will be further described below in conjunction with a specific embodiment. For ease of understanding, the capacitor as shown in FIG. 1 is manufactured in this embodiment. Certainly, the capacitors shown in FIGS. 2 to 7 may also be manufactured by using the manufacturing method for a capacitor in the embodiment, except that there is slightly different in parts, such as design of a trench, and coverage of an insulating layer and a conductive layer. For brevity, details are not described herein again.

Step 1: A boron-doped silicon wafer with resistivity of 0.001-0.005 Sam, a crystal orientation of (100), and a thickness of 750 μm is selected as a semiconductor substrate. A layer of photoresist is spin-coated on an upper surface (front side) of the semiconductor substrate, and after exposure and development, a circular hole of photoresist is formed on the upper surface of the semiconductor substrate, and a diameter of the circular hole is 10 µm. A trench having a depth of 120 µm is then processed by using a DRIE process. Finally, the photoresist is removed.

Step 2: By means of an ALD process, hafnium oxide (HfO$_2$) having a thickness of 40 nm is deposited on the upper surface of the semiconductor substrate and a surface of the trench as a first insulating layer.

Step 3: By means of the ALD process, a layer of titanium nitride (TiN) having a thickness of 50 nm is deposited on a surface of the first insulating layer (hafnium oxide layer) as a first conductive layer.

Step 4: The upper surface of the semiconductor substrate is covered with a photosensitive dry film, and after exposure and development, a dry film protection layer covering the trench and its edges is formed. Next, hafnium oxide and titanium nitride not covered with the dry film are removed by dry etching. Finally, the dry film is removed to obtain a pattern of the first insulating layer and the first conductive layer.

It should be noted that the photosensitive dry film occupies a partial region of the upper surface of the semiconductor substrate, and after the hafnium oxide and the titanium nitride not covered with the dry film are removed by dry etching, the upper surface of the semiconductor substrate is exposed.

Step 5: By means of the ALD process, hafnium oxide (HfO$_2$) having a thickness of 40 nm is deposited on the upper surface of the semiconductor substrate and a surface of the first conductive layer as a second insulating layer.

Step 6: An upper surface of the second insulating layer is covered with a layer of photosensitive dry film, and after exposure and development, a dry film protection layer covering the second insulating layer and its edges is formed. Next, hafnium oxide not covered with the dry film is removed by dry etching. Finally, the dry film is removed to obtain a pattern of the second insulating layer.

It should be noted that the photosensitive dry film occupies a partial region of the second insulating layer, and after the hafnium oxide not covered with the dry film is removed by dry etching, the upper surface of the semiconductor substrate is exposed. Meanwhile, at least one window penetrating the second insulating layer is formed on the second insulating layer to expose an upper surface of the first conductive layer, and the second insulating layer covers the first insulating layer and the first conductive layer.

Step 7: A second conductive layer is deposited on the upper surface of the semiconductor substrate and an upper surface and an inner surface of the second insulating layer, and in the at least one window.

Specifically, first, by means of the ALD process, a layer of titanium nitride (TiN) having a thickness of 50 nm is deposited, and then by means of a PVD process, a layer of copper having a thickness of 3 µm is deposited to obtain the second conductive layer.

Step 8: An upper surface of the second conductive layer is covered with a layer of photosensitive dry film, and after exposure and development, a dry film protection layer covering the trench and its edges is formed. Next, titanium nitride and copper not covered with the dry film are removed by dry etching. Finally, the dry film is removed to obtain a first conductive region and a second conductive region that are independent from each other, the first conductive region is electrically connected to the semiconductor substrate, and the second conductive region is electrically connected to the first conductive layer.

A person skilled in the art can understand that preferred embodiments of the present disclosure are described in detail above with reference to the accompanying drawings. However, the present disclosure is not limited to specific details in the foregoing embodiments. Within the technical concept of the present disclosure, a variety of simple variants may be made to the technical solutions of the present disclosure, and these simple variants are within the protection scope of the present disclosure.

In addition, it should be noted that various specific technical features described in the foregoing specific embodiments may be combined in any suitable manner under the condition of no contradiction. In order to avoid unnecessary repetition, various possible combination ways will not be separately described in the present disclosure.

In addition, any combination may be made between various embodiments of the present disclosure without departing from the idea of the present disclosure, and it should also be regarded as the disclosure of the present disclosure.

What is claimed is:

1. A capacitor, wherein the capacitor comprises:
   a semiconductor substrate;
   at least one trench provided in the semiconductor substrate and formed downward from an upper surface of the semiconductor substrate;
   a first conductive layer provided above the semiconductor substrate and in the trench;
   a first insulating layer provided between the semiconductor substrate and the first conductive layer to isolate the first conductive layer from the semiconductor substrate;
   a second conductive layer provided above the semiconductor substrate and in the trench, the second conductive layer comprising a first conductive region and a second conductive region that are independent from each other, the first conductive region being electrically connected to the semiconductor substrate, and the second conductive region being electrically connected to the first conductive layer; and
   a second insulating layer provided between the first conductive layer and the second conductive layer to isolate the first conductive region from the first conductive layer and isolate the second conductive region from the semiconductor substrate;
   at least one conductive layer provided above the semiconductor substrate and in the trench, and located between the first conductive layer and the second conductive layer; and
   at least one insulating layer provided between different conductive layers of the at least one conductive layer to isolate the at least one conductive layer respectively, and provided between the second conductive layer and the at least one conductive layer to isolate the second conductive region from the at least one conductive layer and isolate the second conductive region from the semiconductor substrate.

2. The capacitor according to claim 1, wherein the second insulting layer is provided with at least one window, and the second conductive layer is provided in the at least one window so that the second conductive region is electrically connected to the first conductive layer.

3. The capacitor according to claim 2, wherein projected areas of the first insulating layer and the first conductive layer on the semiconductor substrate are the same, and a projected area of the second insulating layer on the semiconductor substrate is larger than the projected area of the first conductive layer on the semiconductor substrate.

4. The capacitor according to claim 1, wherein a projected area of the first insulating layer on the semiconductor substrate is larger than a projected area of the first conductive layer on the semiconductor substrate, and a projected area of the second insulating layer on the semiconductor substrate is larger than the projected area of the first conductive layer on the semiconductor substrate.

5. The capacitor according to claim 1, wherein the first conductive region and the second conductive region are isolated by air.

6. The capacitor according to claim 1, wherein the first insulating layer and/or the second insulating layer comprises at least one of:
a silicon oxide layer, a silicon nitride layer, a metal oxide layer, and a metal nitride layer.

7. The capacitor according to claim 1, wherein the first conductive layer and/or the second conductive layer comprises at least one of:
a heavily doped polysilicon layer, a carbon-based material layer, a metal layer, and a titanium nitride layer.

8. The capacitor according to claim 1, wherein the first conductive region is configured as a first electrode of the capacitor, and the second conductive region is configured as a second electrode of the capacitor.

9. The capacitor according to claim 1, wherein each of the at least one insulating layer comprises at least one of:
a silicon oxide layer, a silicon nitride layer, a metal oxide layer, and a metal nitride layer.

10. The capacitor according to claim 9, wherein each of the at least one conductive layer comprises at least one of:
a heavily doped polysilicon layer, a carbon-based material layer, a metal layer, and a titanium nitride layer.

11. The capacitor according to claim 1, wherein the first conductive region is further electrically connected to the at least one conductive layer.

12. The capacitor according to claim 11, wherein the at least one conductive layer comprises a third conductive layer, and the at least one insulating layer comprises a third insulating layer, wherein
the third conductive layer is provided above the semiconductor substrate and in the trench, and located between the first conductive layer and the second conductive layer; and
the third insulating layer is provided between the second conductive layer and the third conductive layer to isolate the second conductive region from the third conductive layer and isolate the second conductive region from the semiconductor substrate.

13. The capacitor according to claim 12, wherein the second insulting layer and/or the third insulating layer is provided with at least one window, and the second conductive layer is provided in the at least one window so that the second conductive region is electrically connected to the first conductive layer.

14. The capacitor according to claim 12, wherein projected areas of the first insulating layer and the first conductive layer on the semiconductor substrate are the same, and projected areas of the second insulating layer and the third conductive layer on the semiconductor substrate are the same.

15. The capacitor according to claim 12, wherein projected areas of the first insulating layer and the first conductive layer on the semiconductor substrate are the same, and a projected area of the second insulating layer on the semiconductor substrate is larger than projected areas of the third conductive layer and the third insulating layer on the semiconductor substrate.

16. A manufacturing method for a capacitor, comprising:
etching a semiconductor substrate to form at least one trench in the semiconductor substrate, wherein the trench is formed downward from an upper surface of the semiconductor substrate, and a depth of the trench is less than a thickness of the semiconductor substrate;
depositing a first insulating layer on the upper surface of the semiconductor substrate and an inner surface of the at least one trench;
depositing a first conductive layer on an upper surface and an inner surface of the first insulating layer;
performing photolithography processing on the first insulating layer and the first conductive layer to expose the upper surface of the semiconductor substrate;
depositing a second insulating layer on an upper surface and an inner surface of the first conductive layer and the upper surface of the semiconductor substrate;
performing photolithography processing on the second insulating layer to expose the upper surface of the semiconductor substrate, and forming at least one window on the second insulating layer to expose the upper surface of the first conductive layer, wherein the second insulating layer covers the first insulating layer and the first conductive layer;
depositing a second conductive layer on an upper surface and an inner surface of the second insulating layer and the upper surface of the semiconductor substrate, and in the at least one window; and
performing photolithography processing on the second conductive layer to form a first conductive region and a second conductive region that are independent from each other, wherein the first conductive region is electrically connected to the semiconductor substrate, and the second conductive region is electrically connected to the first conductive layer.

17. The method according to claim 16, wherein the method further comprises:
performing photolithography processing on the second conductive region to expose the second insulating layer at a periphery of the second conductive region.

18. A manufacturing method for a capacitor, comprising:
etching a semiconductor substrate to form at least one trench in the semiconductor substrate, wherein the trench is formed downward from an upper surface of the semiconductor substrate, and a depth of the trench is less than a thickness of the semiconductor substrate;
depositing a first insulating layer on the upper surface of the semiconductor substrate and an inner surface of the at least one trench;
depositing a first conductive layer on an upper surface and an inner surface of the first insulating layer;
performing photolithography processing on the first conductive layer to expose the upper surface of the first insulating layer;
depositing a second insulating layer on an upper surface and an inner surface of the first conductive layer and the upper surface of the first insulating layer;
performing photolithography processing on the first insulating layer and the second insulating layer to expose the upper surface of the semiconductor substrate, and forming at least one window on the second insulating layer to expose the upper surface of the first conductive layer, wherein the second insulating layer covers the first conductive layer;
depositing a second conductive layer on an upper surface and an inner surface of the second insulating layer and the upper surface of the semiconductor substrate, and in the at least one window; and performing photolithography processing on the second conductive layer to form a first conductive region and a second conductive region that are independent from each other, wherein the first conductive region is electrically connected to the semiconductor substrate, and the second conductive region is electrically connected to the first conductive layer.

19. The method according to claim 18, wherein the method further comprises:

performing photolithography processing on the second conductive region to expose the second insulating layer at a periphery of the second conductive region.

* * * * *